(12) United States Patent
Kuo et al.

(10) Patent No.: US 9,207,261 B2
(45) Date of Patent: *Dec. 8, 2015

(54) HIGH FREQUENCY PROBING STRUCTURE

(71) Applicant: Taiwan Semiconductor Manufacturing Company, Ltd., Hsin-Chu (TW)

(72) Inventors: Yung-Hsin Kuo, Zhubei (TW); Wensen Hung, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/530,307

(22) Filed: Oct. 31, 2014

(65) Prior Publication Data

US 2015/0048861 A1    Feb. 19, 2015

Related U.S. Application Data

(62) Division of application No. 12/982,541, filed on Dec. 30, 2010, now Pat. No. 8,878,560.

(51) Int. Cl.
*G01R 31/00* (2006.01)
*G01R 1/067* (2006.01)
*G01R 1/073* (2006.01)
*G01R 31/28* (2006.01)
*G01R 1/04* (2006.01)

(52) U.S. Cl.
CPC .......... *G01R 1/06772* (2013.01); *G01R 1/0408* (2013.01); *G01R 1/07371* (2013.01); *G01R 1/07378* (2013.01); *G01R 31/2889* (2013.01); *Y10T 29/49004* (2015.01); *Y10T 29/49126* (2015.01); *Y10T 29/49144* (2015.01); *Y10T 29/49167* (2015.01)

(58) Field of Classification Search
USPC ............. 324/756.03, 754.07, 755.01, 754.01, 324/754.03, 755.11; 29/840, 830, 853, 593, 29/603.09, 854
See application file for complete search history.

(56) References Cited

U.S. PATENT DOCUMENTS 5,534,784 A    7/1996 Lum et al.
5,801,432 A    9/1998 Rostoker et al.
(Continued)

OTHER PUBLICATIONS

Otto Weeden, "Probe Card Tutorial," 2003, Keithley Instruments, Inc., Printed in the United States No. 2437-0303, Cleveland, Ohio.
(Continued)

*Primary Examiner* — Tung X Nguyen
*Assistant Examiner* — Thang Le
(74) *Attorney, Agent, or Firm* — Haynes and Boone, LLP

(57) ABSTRACT

A probe card for wafer level test includes a space transformer having a power line, a ground line, and signal lines embedded therein, wherein the space transformer includes a first surface having a first pitch and a second surface having a second pitch substantially less than the first pitch, a printed circuit board configured approximate the first surface of the space transformer, a first power plane disposed on the first surface of the space transformer and patterned to couple the power line and the ground line to the printed circuit board, and a second power plane disposed on a surface of the printed circuit board and patterned to couple the power line and the ground line of the space transformer to the printed circuit board, wherein the second power plane is in electrical connection with the first power plane.

20 Claims, 13 Drawing Sheets

(56) References Cited

U.S. PATENT DOCUMENTS

| | | | |
|---|---|---|---|
| 6,050,829 A * | 4/2000 | Eldridge et al. | 439/67 |
| 6,130,546 A | 10/2000 | Azizi | |
| 6,297,657 B1 | 10/2001 | Thiessen et al. | |
| 6,661,244 B2 | 12/2003 | McQuade et al. | |
| 6,727,714 B2 | 4/2004 | Deguchi | |
| 7,180,318 B1 | 2/2007 | Mahoney et al. | |
| 7,245,134 B2 | 7/2007 | Granicher et al. | |
| 7,495,459 B2 * | 2/2009 | Tunaboylu et al. | 324/750.03 |
| 7,948,252 B2 * | 5/2011 | Grube et al. | 324/754.07 |
| 8,026,733 B2 | 9/2011 | Lee et al. | |
| 8,378,704 B2 * | 2/2013 | Itou et al. | 324/756.03 |
| 2002/0190743 A1 | 12/2002 | Nakata et al. | |
| 2003/0027423 A1 | 2/2003 | Zhou et al. | |
| 2003/0038647 A1 | 2/2003 | Eldridge et al. | |
| 2004/0185699 A1 * | 9/2004 | Yang et al. | 439/325 |
| 2005/0156611 A1 | 7/2005 | Shinde et al. | |
| 2006/0006892 A1 | 1/2006 | Green et al. | |
| 2006/0022688 A1 * | 2/2006 | Giga et al. | 324/754 |
| 2006/0028225 A1 | 2/2006 | von Appen | |
| 2006/0066332 A1 * | 3/2006 | Miller | 324/754 |
| 2006/0091510 A1 | 5/2006 | Liu et al. | |
| 2006/0125498 A1 * | 6/2006 | Liu et al. | 324/754 |
| 2006/0244470 A1 * | 11/2006 | Shinde et al. | 324/754 |
| 2006/0250150 A1 | 11/2006 | Tunaboylu et al. | |
| 2007/0045868 A1 * | 3/2007 | Furuyama et al. | 257/778 |
| 2007/0054513 A1 * | 3/2007 | Mathieu et al. | 439/66 |
| 2007/0096755 A1 | 5/2007 | Parrish et al. | |
| 2007/0145989 A1 * | 6/2007 | Zhu et al. | 324/754 |
| 2008/0150571 A1 | 6/2008 | Miller et al. | |
| 2009/0223043 A1 | 9/2009 | Hsu et al. | |
| 2010/0109688 A1 | 5/2010 | Eldridge et al. | |
| 2010/0176831 A1 | 7/2010 | Palcisko et al. | |
| 2012/0169367 A1 | 7/2012 | Kuo | |

OTHER PUBLICATIONS

Dirk D. Brown et al., "Two Fundamental Approaches to Enabling High Performance LGA Connections", HOC Inc., Sunnyvale, CA, pp. 508-513.

* cited by examiner

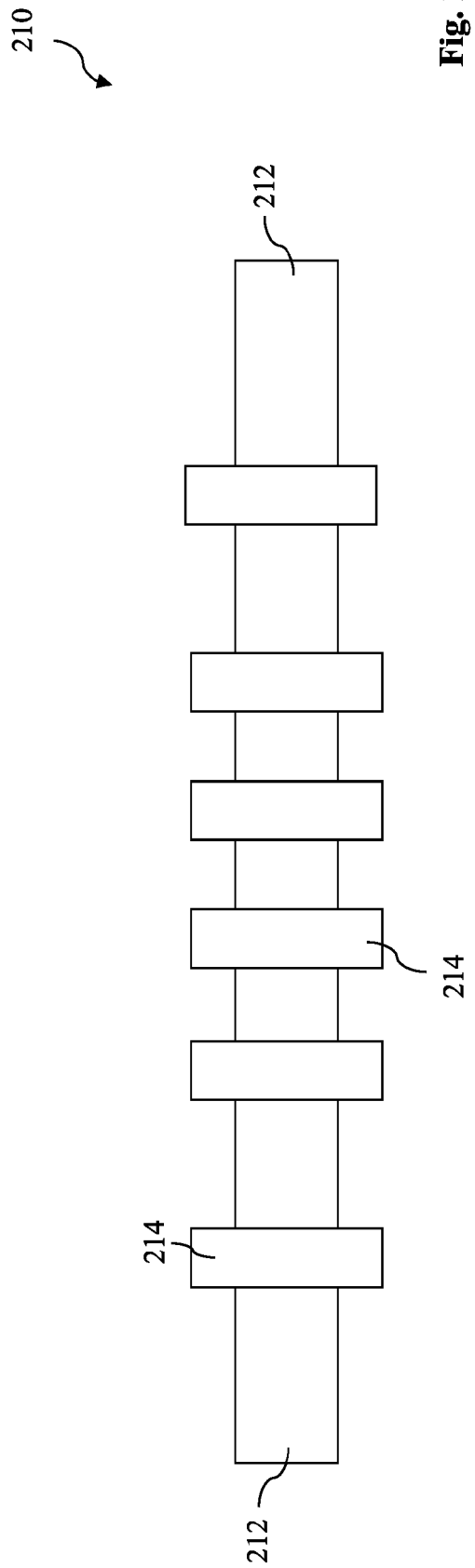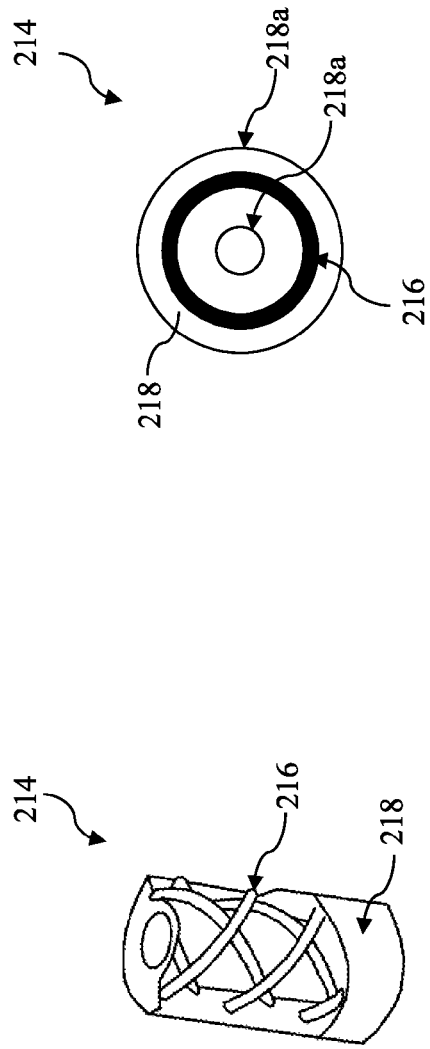
Fig. 12
Fig. 14
Fig. 13

HIGH FREQUENCY PROBING STRUCTURE

CROSS REFERENCE

The present application is a divisional of U.S. patent application Ser. No. 12/982,541 filed Dec. 30, 2010 and entitled "High Frequency Probing Structure," the disclosure of which is hereby incorporated by reference in its entirety.

BACKGROUND

Semiconductor manufacturing implements wafer probe testing in backend processing to qualify and sort integrated circuit (IC) dies on a wafer before wafer dicing. In a wafer probe test, a probe card is used and configured to couple a tester to a wafer to be tested. The probe card includes a probe head and a substrate to electrically interconnect the probe head to a printed circuit board (PCB). In high frequency and power integrity probing tests, the substrate can cause ground-bounce issues and degrade overall electrical performance of the probe card. Therefore, a probe card structure and method of making the same are needed to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 12 and 15 illustrate schematic views of an interposer incorporated in the probe card of FIG. 6 and constructed according to other embodiments.

FIG. 13 illustrates a 3-dimensional perspective view of a spring connector incorporated in the interposer of FIG. 12 or FIG. 15.

FIG. 14 illustrates a top view of the spring connector of FIG. 13 and incorporated in the interposer of FIG. 12 or FIG. 15.

DETAILED DESCRIPTION

Figure 1:
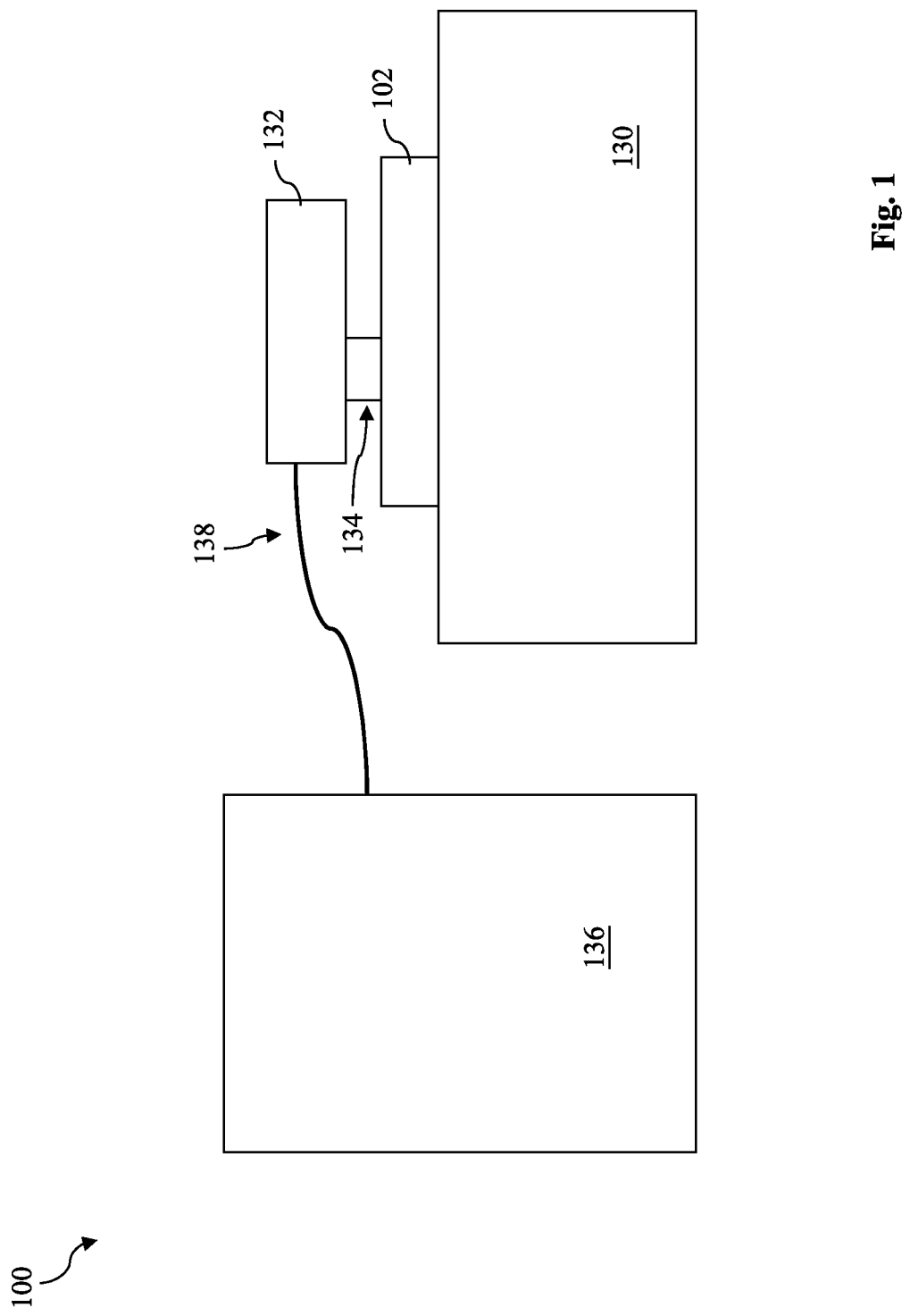
FIG. 1 is a schematic view of one embodiment of a wafer-level test system constructed according to aspects of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
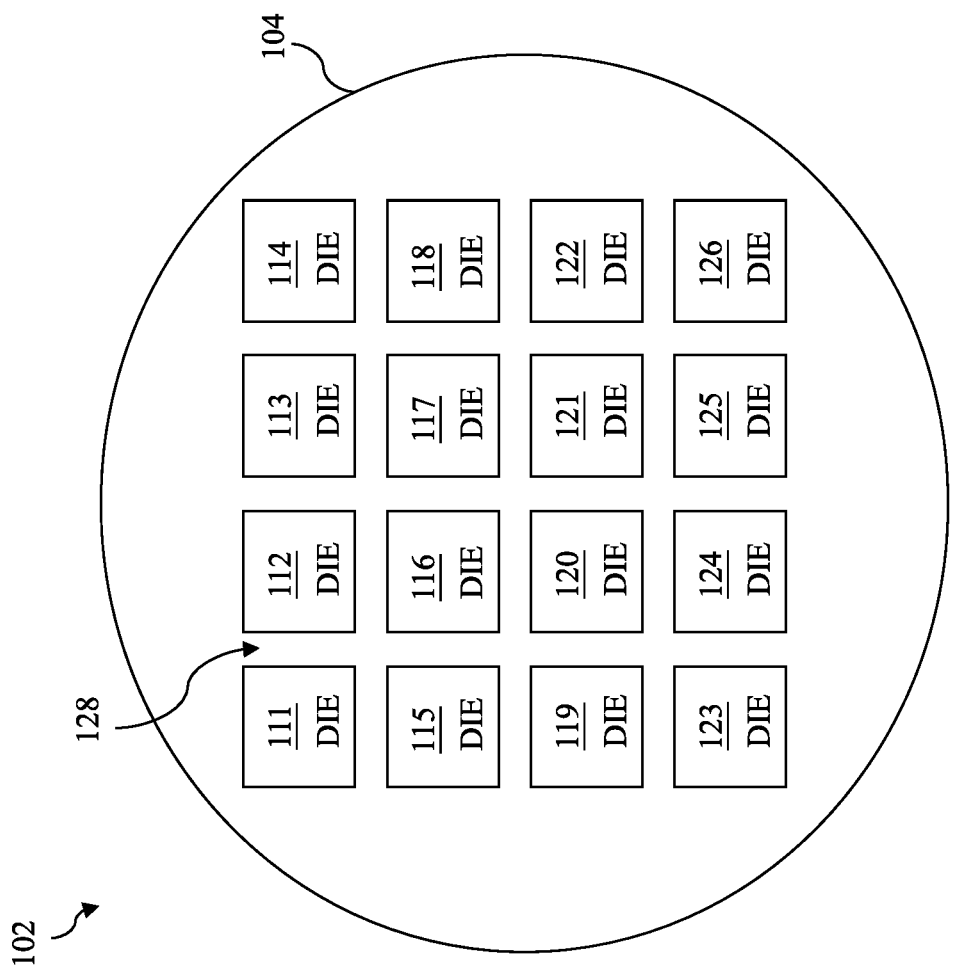
FIG. 2 is a top view of a semiconductor wafer to be tested by the wafer-level test system of FIG. 1.

FIG. 1 is a schematic view of one embodiment of a wafer-level test system (or wafer test system) 100 constructed according to aspects of the present disclosure. The wafer-level test system 100 is designed to test a semiconductor wafer 102 at various stages for different purposes including acceptance test, characterization test, burn-in/stress test, or production test. An exemplary semiconductor wafer 102 is further illustrated in FIG. 2 in a top view. The semiconductor wafer 102 includes a substrate 104, such as a silicon substrate. Alternatively, the substrate 104 may include other elementary semiconductor, such as germanium. The substrate 104 may also include a compound semiconductor, such as silicon germanium, silicon carbide, gallium arsenic, indium arsenide, gallium nitride, and indium phosphide. The substrate 104 may include an alloy semiconductor, such as silicon germanium carbide, gallium arsenic phosphide, and gallium indium phosphide. The substrate 104 may include an epitaxial layer. For example, the substrate may have an epitaxial layer overlying a bulk semiconductor. Furthermore, the substrate 104 may include a semiconductor-on-insulator (SOI) structure. For example, the substrate may include a buried oxide (BOX) layer formed by a process such as separation by implanted oxygen (SIMOX).

The substrate 104 may include various p-type doped regions and/or n-type doped regions, implemented by a process such as ion implantation and/or diffusion. These doped regions in the substrate 104 may provide various functional devices or features, such as a metal-oxide-semiconductor (MOS) transistor, an imaging sensor, and combinations thereof. The substrate 104 may include lateral isolation features disposed to separate various devices formed on the substrate 104. For example, the substrate 104 includes shallow trench isolation (STI) formed by a process including lithography patterning, etching, and dielectric material deposition. The substrate 104 may further at least partially include a plurality of patterned dielectric layers and patterned conductive layers combined to form interconnections configured to couple the various p-type and n-type doped regions and other functional features. For example, the substrate 104 may include a portion of a multi-layer interconnect (MLI) structure and an inter-level dielectric (ILD) disposed in the MLI structure.

The semiconductor wafer 102 includes a plurality of dies 111-126 separated by scribe street 128. Each of the dies 111-126 includes an integrated circuit (IC) having various electrical features configured and coupled to form a functional circuit or an electrical device. In various embodiments, the integrated circuit includes a field-effect transistor (FET), a light-emitting diode (LED), an imaging sensor, or a memory device. In one embodiment, the integrated circuits formed in the dies of the wafer 102 include high frequency devices with a data rate of 1 gigabit/sec or higher, such as a blue tooth device (about 2.4 gigabits/sec) or a 3G communication device (about 2.4 gigabits/sec to about 6 gigabits/sec). The dies 111-126 also each include a plurality of bonding pads (not illustrated) that can make electrical contact with the probe card. Various electrical parameters are gathered through testing the dies 111-126.

As noted, the dies 111-126 are separated on the wafer 102 by a plurality of scribe street (or scribe line) 128. The scribe street 128 is a region of the wafer 102 that will be sawed in a later process, so that the dies 111-126 can be separated and packaged as IC dies. In one example, a plurality of test keys are implemented in the scribe street 128. The test keys each include a plurality of test pads that can make electrical contact with a probe card.

Referring back to FIG. 1, the wafer test system 100 includes a wafer prober 130 designed to hold the wafer 102 and manipulate a probe card 132, such that the probe card 132 can step across the wafer 102 and contact each die of the wafer 102 for testing. In another embodiment, multiple dies, such as a subset of the plurality of dies, can be tested in parallel by the disclosed wafer test system 100. More particularly, a group of 2, 4, 8, or 16 dies are tested in parallel by the wafer test system 100 according to various examples.

The wafer test system 100 includes the probe card 132 positioned on the wafer 102 and configured to contact to the wafer 102 through a plurality of needles 134 integrated with the probe card 132. The plurality of needles 134 electrically contact the bonding pads of one die in the wafer 102 for providing testing signals and collecting testing results. The probe card 132 provides an interface to couple the wafer 102 to a testing module (or a tester) 136 through a connecting cable 138.

The tester 136 includes an electric test circuit to provide testing signals and collect testing results from the wafer 102. The tester 136 further includes a computer-based control system to control the test procedure; coordinate testing events among the wafer prober 130, the probe card 132, and the electric test circuit; and further analyze test results to evaluate the wafer 102.

The wafer test system 100 may further include a test head (not shown) to secure the probe card 132 and enable the stepping control of the probe card 132 by the wafer prober 130. The wafer test system 100 may further include a probe interface board or PIB (not shown) configured between the test head and the probe card 132. The PIB may provide electric coupling between the tester 136 and the probe card 132. The test head, PIB, and probe card 132 are assembled together during testing. The wafer test system 100 may additionally include other features, such as a spring contactor assembly, to enable or enhance the wafer test system 100.

Figure 3:
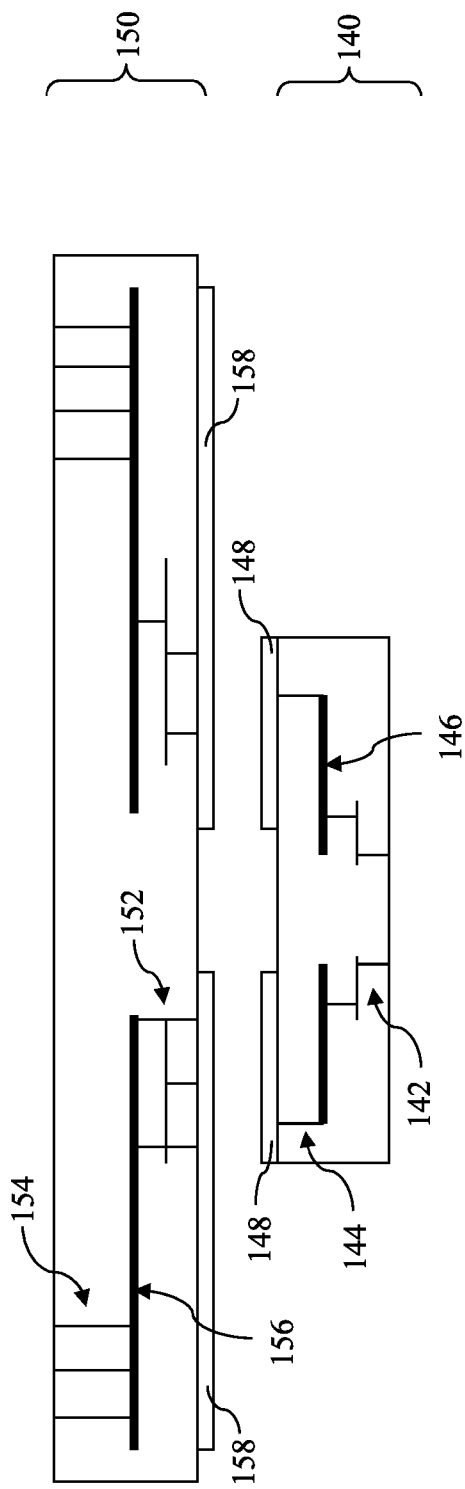
FIGS. 3-6 and 9-11 illustrate schematic views of a probe card incorporated in the wafer-lever test system of FIG. 1 constructed according to various embodiments of the present disclosure.

With reference to FIG. 3, the probe card 132 is further described. The probe card 132 includes a space transformer 140 having a structure and materials made of a multi-layer organic (MLO) material or a multi-layer ceramic (MLC) material. In one embodiment, the MLO material includes bismaleimide triazine (BT) or glass reinforced epoxy laminated sheets. The spacer transformer 140 includes various conductive lines for power and signal interconnection, the various conductive lines being formed in the MLO or MLC structure. The conductive lines include a first portion 142 disposed in a bottom portion of the space transformer 140 and coupled to the plurality of needles 134. The first portion of conductive lines 142 are arranged and configured with smaller pitches with the plurality of needles 134 to align with the bonding pads of the wafer 102. In one embodiment, the first portion of conductive lines 142 have a pitch ranging between about 30 microns and about 300 microns. The conductive lines also include a second portion 144 disposed in a top portion of the space transformer 140. The second portion of conductive lines 144 are coupled with the first portion of conductive lines 142, and the second portion of conductive lines 144 are configured with greater pitches than the first portion of conductive lines 142. In one embodiment, the second portion of conductive lines 144 have a pitch of about 1 mm or greater.

The space transformer 140 provides an interface to transform wiring space from smaller pitches to greater pitches, such that small pitch needles and bonding pads can be coupled to large pitch contacts for testing coupling (therefore, feature 140 is referred to as the space transformer).

The space transformer 140 further include one or more conductive plates 146 embedded in the MLO or MLC structure. The embedded plates 146 have a two-dimensional structure with a large area. The embedded plates 146 are incorporated in the conductive lines. In one embodiment, the embedded plates have more than one layer (not shown in FIG. 3). To improve power coupling integrity and reduce coupling resistance, the space transformer 140 also includes a conductive plate 148 formed on the top surface of the space transformer 140. The conductive plate 148 is coupled to power and ground lines. The conductive plate 148 is formed from metal, such as copper foil, and is patterned such that it is properly coupled to the power and ground lines.

The probe card 132 includes a printed circuit board (PCB) 150 configured adjacent the space transformer 140 and coupled to the power, ground, and signal lines of the space transformer 140. The PCB 150 includes various conductive lines to provide electrical interconnection. The PCB 150 is laminated with epoxy resin material with conductive lines formed therein. The conductive lines include a first portion 152 disposed in a bottom portion of the PCB 150. The first portion of conductive lines 152 are arranged to be aligned with and coupled to the second portion of conductive lines 144 of the spacer transformer 140. The conductive lines also includes a second portion 154 disposed in a top portion of the PCB 150 and coupled to various electric lines of the connection cable 138.

The PCB 150 further includes one or more embedded conductive plates 156. The embedded plates 156 have a two-dimensional structure with a large area. The embedded plates 154 are incorporated in the conductive lines to enhance coupling integrity of the power and ground lines. In one embodiment, the embedded plates have more than one layer (not shown).

To further improve power coupling integrity and reduce coupling resistance, the PCB 150 may additionally include a conductive plate 158 formed on the top surface of the PCB 150 and coupled to the power and ground lines. The conductive plate 158 is formed from metal, such as copper foil, and is patterned such that it is properly coupled to the power and ground lines. In one embodiment, the conductive plate 158 is patterned similarly as the conductive plate 148 for proper coupling. In one example, the conductive plate 158 is patterned such that the conductive plate 158 matches the conductive plate 148 in geometry and position so that efficient coupling is achieved thereby. The conductive plates 148 and 158 are collectively referred to as power planes. The power planes include copper foil in one embodiment. In one example, the copper foil has a thickness ranging between about 0.5 oz/ft$^2$ and about 1 oz/ft$^2$, where 1 oz/ft$^2$ corresponds to a physical thickness of about 34.1 micron.

In one embodiment, the signal lines are coupled between the PCB 150 and the space transformer 140 through point-to-point contacts, such as solder balls. In one example, each solder ball has a contact area of about 500 microns or less. A contact area of the conductive plate 148 is substantially greater than that of the solder balls.

By implementing the conductive plate 148 (or additionally with the conductive plate 158) between the space transformer 140 and the PCB 150, the power and ground lines are coupled between the PCB 150 and the space transformer 140 through the large areas of the conductive plate 148 instead of pointto-point coupling (for example, by solder balls), which improves power and ground coupling efficiency and reduces coupling resistance. Thus, a high frequency device can be properly tested by the wafer test system 100. The test degradation and distortion associated with ground bounce issues are reduced or eliminated as the coupling resistance is substantially reduced. The probe card and the corresponding coupling between the PCB 150 and the space transformer 140 are further described in detail according to various embodiments.

Figure 4:
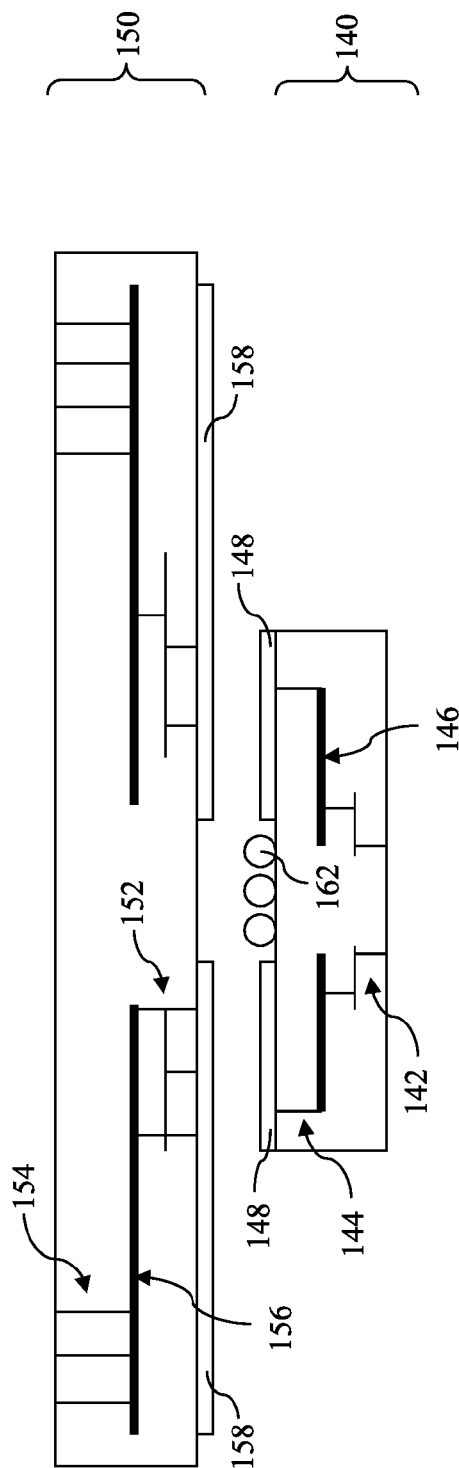

FIG. 4 is a schematic view of a probe card 160 constructed according to various aspects of the present disclosure in one embodiment. The probe card 160 is similar to the probe card 132 of FIG. 3. Particularly, the probe card 160 includes the conductive plate 148 formed on space transformer 140 and the conductive plate 158 formed on PCB 150, which are disposed on corresponding surfaces and configured to couple the power and ground lines between space transformer 140 and PCB 150 for coupling efficiency and reduced resistance. The ground lines may includes ground and ground return lines.

The signal lines are coupled through point-to-point contacts, such as solder balls 162, aligned with signal lines on the PCB 150 and the space transformer 140. The power and ground lines are coupled either directly through the bonding of conductive plates 148 and 158 by a proper bonding technology, such as thermal bonding, or indirectly through the solder balls formed between conductive plates 148 and 158.

Figure 5:
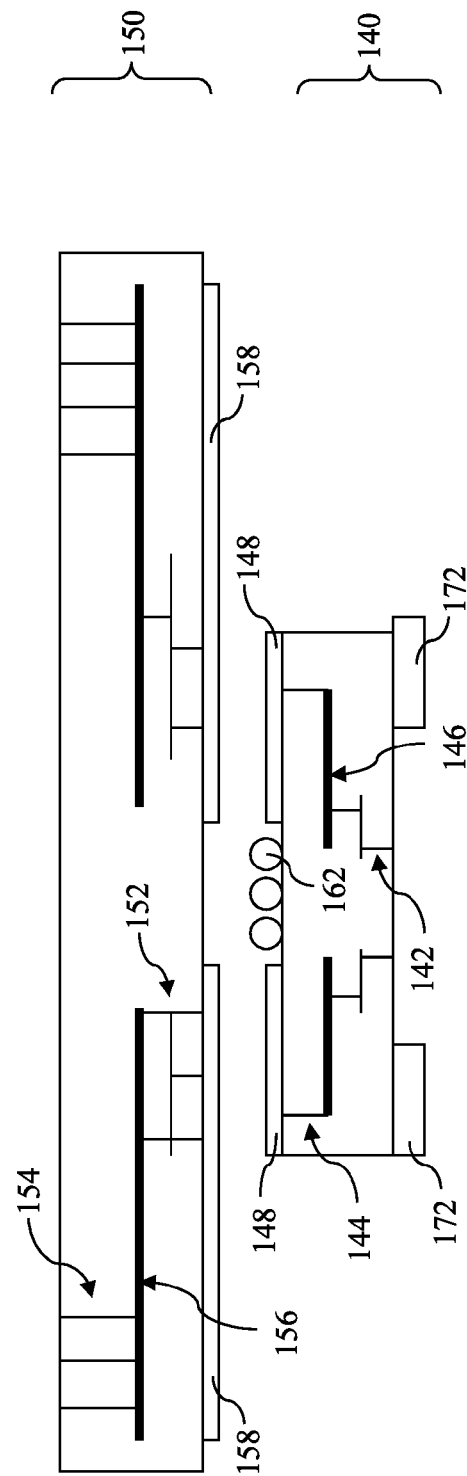

FIG. 5 is a schematic view of a probe card 170 constructed according to various aspects of the present disclosure in another embodiment. The probe card 170 is similar to the probe card 160 of FIG. 4. Particularly, the probe card 170 includes the conductive plate 148 formed on space transformer 140 and the conductive plate 158 formed on PCB 150, which are disposed on corresponding surfaces and configured to couple the power and ground lines between space transformer 140 and PCB 150 for coupling efficiency and reduced resistance. The ground lines may include ground and ground return lines.

The signal lines are coupled through point-to-point contacts, such as solder balls 162, aligned with the signal lines on the PCB 150 and space transformer 140. The power and ground lines are coupled either directly through the bonding of the conductive plates 148 and 158 by a proper bonding technology, such as thermal bonding, or indirectly through the solder balls formed between the conductive plates 148 and 158.

The probe card 170 further includes a high frequency or radio frequency (RF) matching circuit 172 formed on the bottom surface of the space transformer 140 and coupled to the power, ground, and signal lines of the space transformer 140. The RF matching circuit 172 is designed to tune impedance and/or reduce RF interference with the test signal. In one embodiment, the high frequency matching circuit includes an impedance matching circuit that couples a source and a load through one or more transmission lines having a characteristic impedance. The impedance matching circuit may include one or more inductors, capacitors, or resistors configured to transform an impedance of the load to a desired impedance seen by the source. In another embodiment, the high frequency matching circuit also includes other high frequency processing circuits operable to function in the UHF or SHF frequency ranges. For example, the high frequency circuit may include oscillators for providing a high frequency signal, radio-frequency (RF) signal switches for routing high frequency signals, RF attenuators for attenuating high frequency signals, RF amplifiers for amplifying high frequency signals, mixers for mixing a plurality of signals to generate a signal with a new frequency, and filters to filter out signals in an undesired frequency range.

Figure 6:
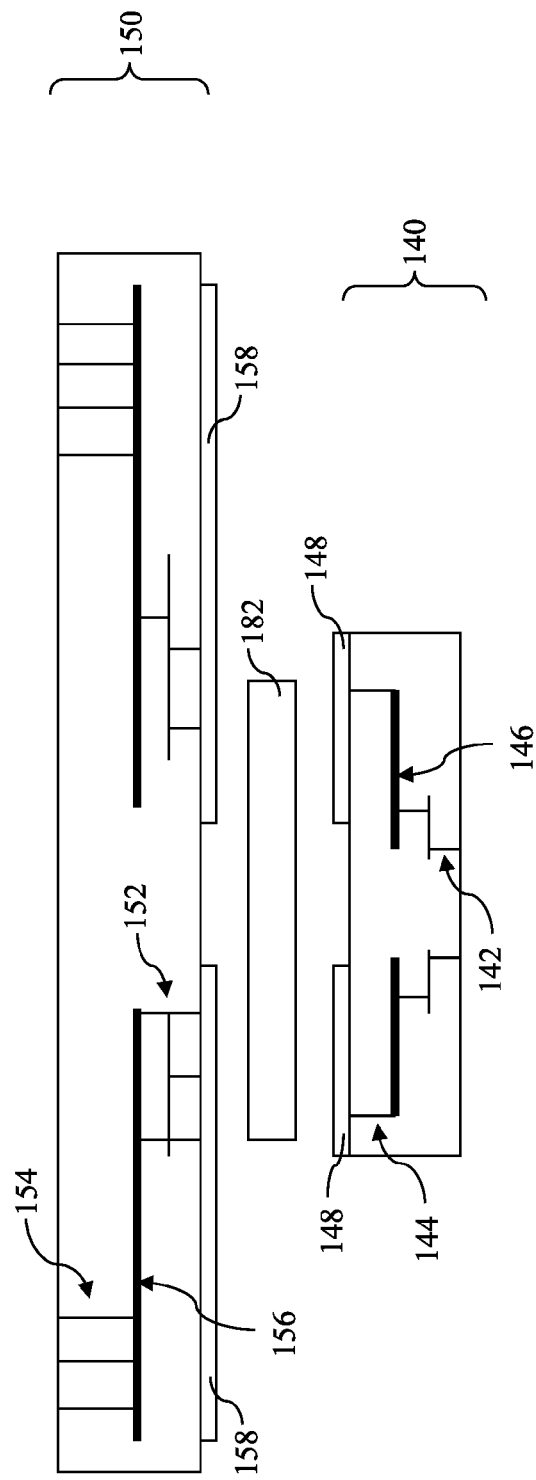

FIG. 6 is a schematic view of a probe card 180 constructed according to various aspects of the present disclosure in another embodiment. The probe card 180 is similar to the probe card 160 of FIG. 4. Particularly, the probe card 180 includes the conductive plate 148 formed on space transformer 140 and the conductive plate 158 formed on PCB 150, which are disposed on corresponding surfaces and aligned with each other.

Figure 7:
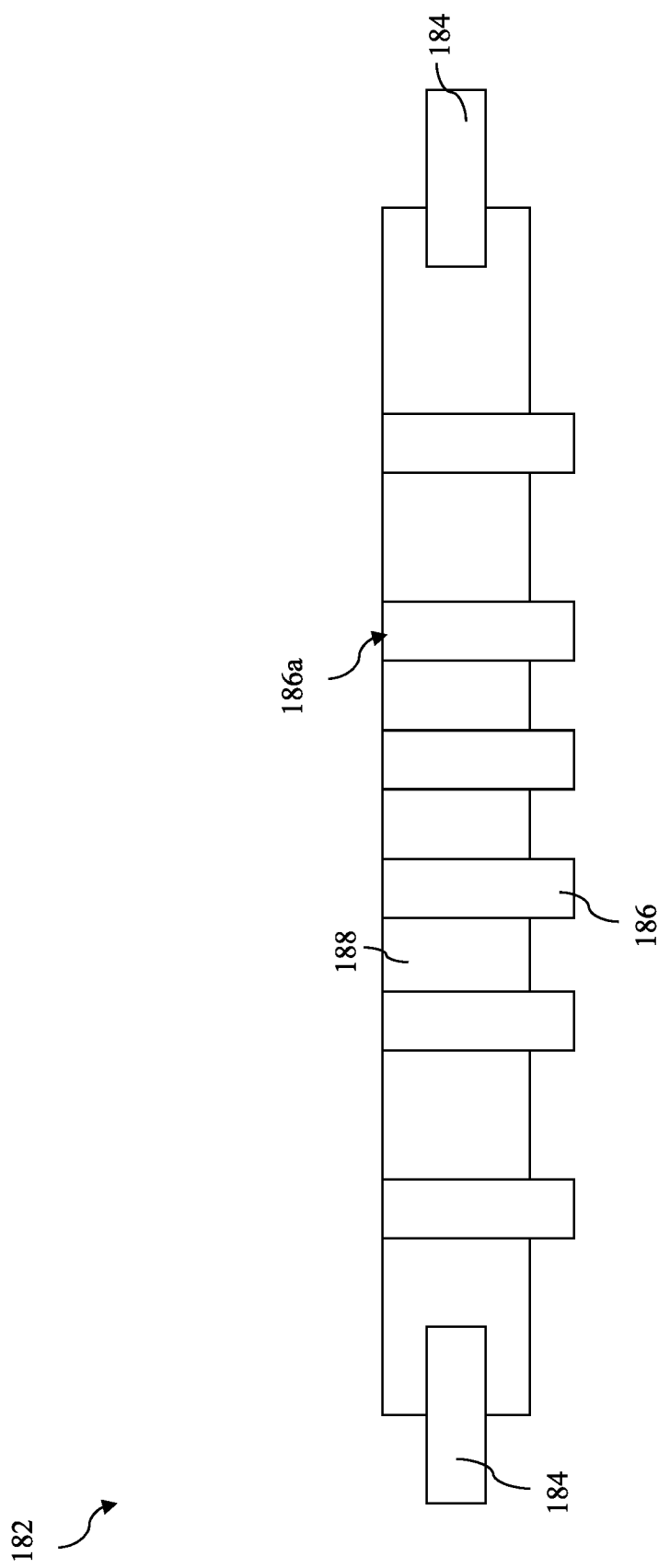
FIGS. 7 and 8 illustrate schematic views of an interposer incorporated in the probe card of FIG. 6 and constructed according to various embodiments.

The probe card 180 further includes an interposer 182 configured between the space transformer 140 and the PCB 150. The interposer 182 is designed to provide an interface for coupling the space transfer 140 to the PCB 150 for coupling efficiency and reduced resistance. The interposer 182 is described in detail with further reference to FIG. 7 in a schematic view according to various aspects in one embodiment. The interposer 182 includes a frame 184 designed to secure the interposer 182. The frame 184 is made of polymeric material (for example, engineered plastic) in one embodiment. The interposer 182 includes a plurality of conductive features 186 disposed in silicon rubber 188 or other suitable material. The conductive features 186 include a conductive material, such as conductive particles/power embedded in the silicon rubber. The conductive features 186 may further include electrode bumps 186*a* formed on the surfaces of the conductive features 186 for proper bonding effect. The conductive features 186 are configured to be aligned with the power, ground, and signal lines of the PCB 150 and the space transformer 140. The interposer 182 is combined with the conductive plates 148 and the conductive plates 158 to provide an interface that couples the PCB 150 and the space transformer 140 with reduced resistance and enhanced test integrity.

Figure 8:
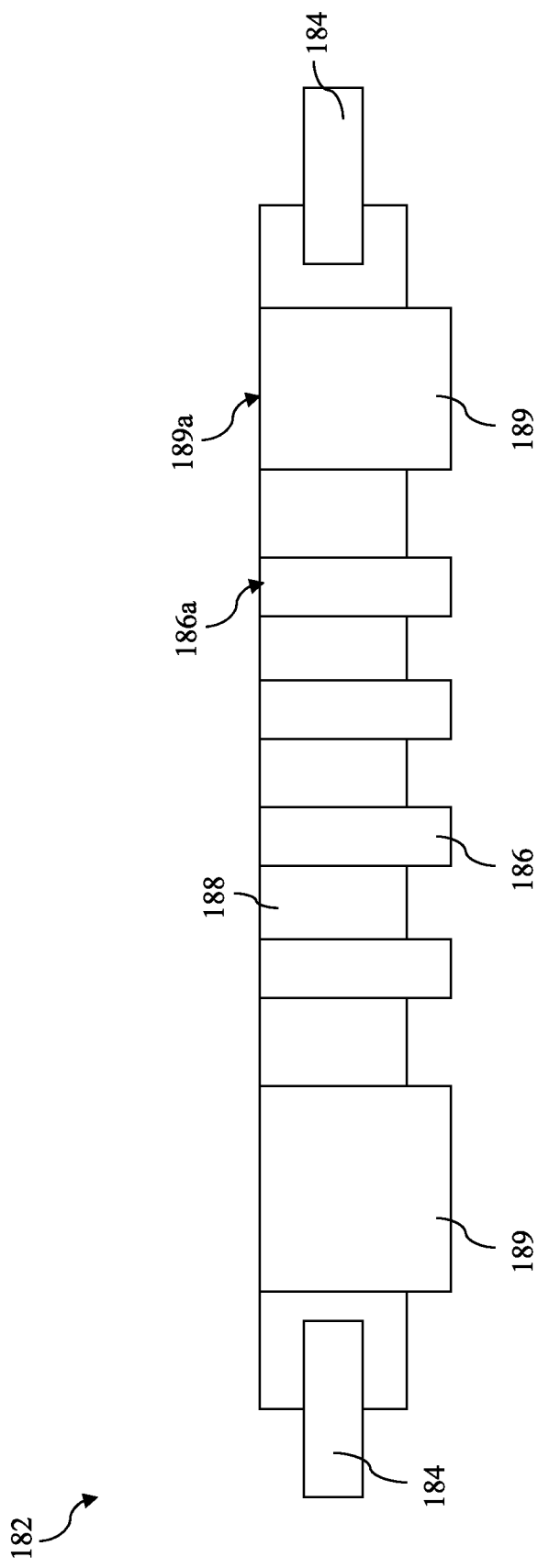

Alternatively, the interposer 182 is designed to include conductive plates 189 having large contact areas to coupled with the conductive plates 148 of the space transformer and the conductive plates 158 of the PCB 150, as illustrated in FIG. 8 in a schematic view according to various aspects in another embodiment. The conductive plates 189 are similar to the conductive features 186 in terms of composition and formation. For example, the conductive features 186 include conductive particles/power embedded in the silicon rubber 188. The conductive plates 189 may further include electrode bumps 189*a* formed on the surfaces of the conductive plates 189 for bonding effect. However, the conductive plates 189 are designed to have large contact areas when viewed in a direction perpendicular to the interposer 182. The large contact areas of the conductive plates 189 are substantially greater than the corresponding contact areas of the conductive features 186. For example, the large contact areas of the conductive plates 189 are more than 4 times the contact areas of the conductive features 186. Further, the conductive plates 189 are configured to be aligned with the conductive plates 148 and 158 when bonded together. For example, the large contact areas of the conductive plates 189 are within the contact areas of the conductive plates 148 and 158 when viewed in the direction perpendicular to the interposer 182. With the conductive plates 189 having large areas, the coupling efficiency is enhanced and the contact resistance is reduced.

Figure 9:
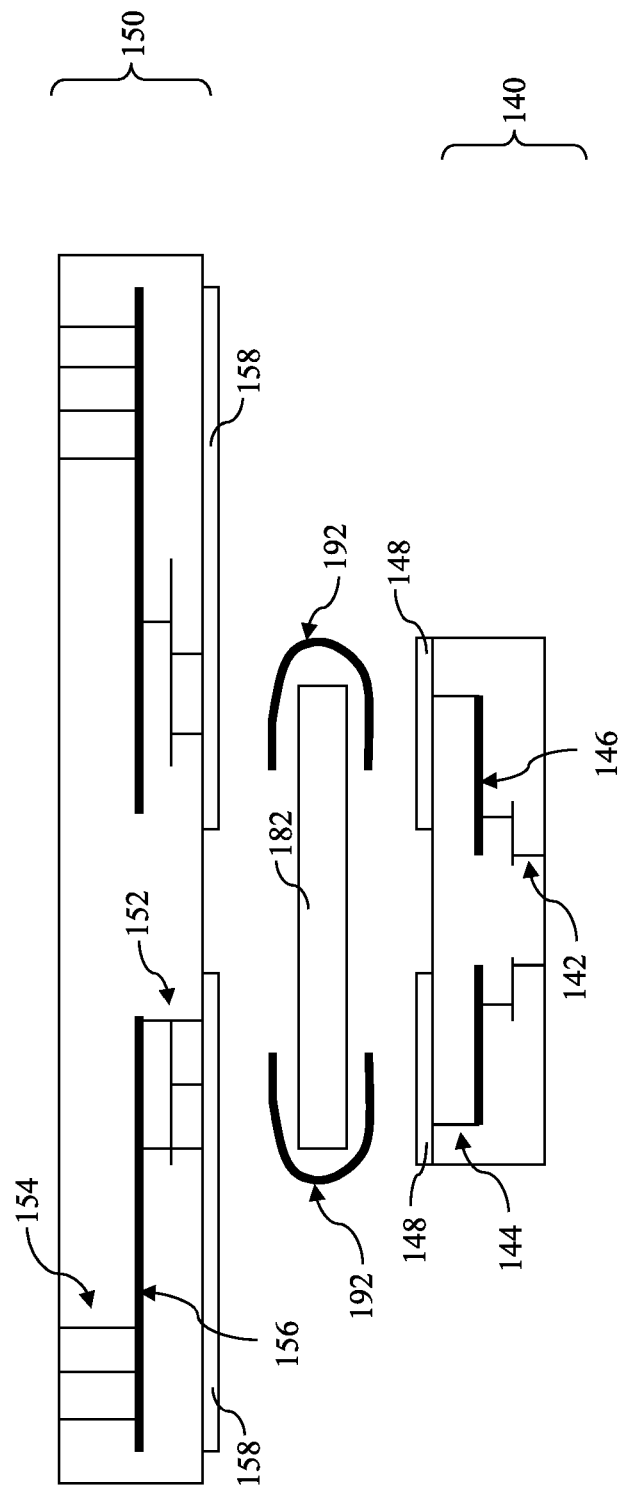

FIG. 9 is a schematic view of a probe card 190 constructed according to various aspects of the present disclosure in another embodiment. The probe card 190 is similar to the probe card 180 of FIG. 6. Particularly, the probe card 190 includes the conductive plate 148 formed on the space transformer 140 and the conductive plate 158 formed on the PCB 150, which are disposed on corresponding surfaces and aligned with each other. The probe card 190 also includes the interposer 182 configured between the space transformer 140 and PCB 150, which is designed to provide an interface for coupling the space transformer 140 to the PCB 150 for coupling efficiency and reduced resistance.

The probe card 190 further includes one or more flexible membrane circuits (or flexible printed circuits) 192 combined with the interposer 182 and configured to couple the PCB 150 and the space transformer 140. The flexible membrane circuits 192 include polymeric materials, such as polyimide and/or polyester. The flexible membrane circuits 192 may include a laminated structure having conductive lines embedded therein. Due to the material's characteristics and the structure's design, the flexible membrane circuit 192 is mechanically flexible and is capable of bending to fit particular space and geometry requirements. In the present case, the flexible membrane circuits 192 are configured on sides of the interposer 182 and each is bended in a way such that one end is inserted between the interposer 182 and the PCB 150, and the another end is inserted between the interposer 182 and the space transformer 140, as illustrated in FIG. 9. Thus, the power and ground lines are efficiently coupled between the space transformer 140 and the PCB 150 by utilizing the conductive plates 148/158, interposer 182, and flexible membrane circuits 192 with reduced coupling resistance. The flexible membrane circuits 192 enables design of power and ground plane structures that provide stable power signal transmission and low power impedance levels.

Figure 10:
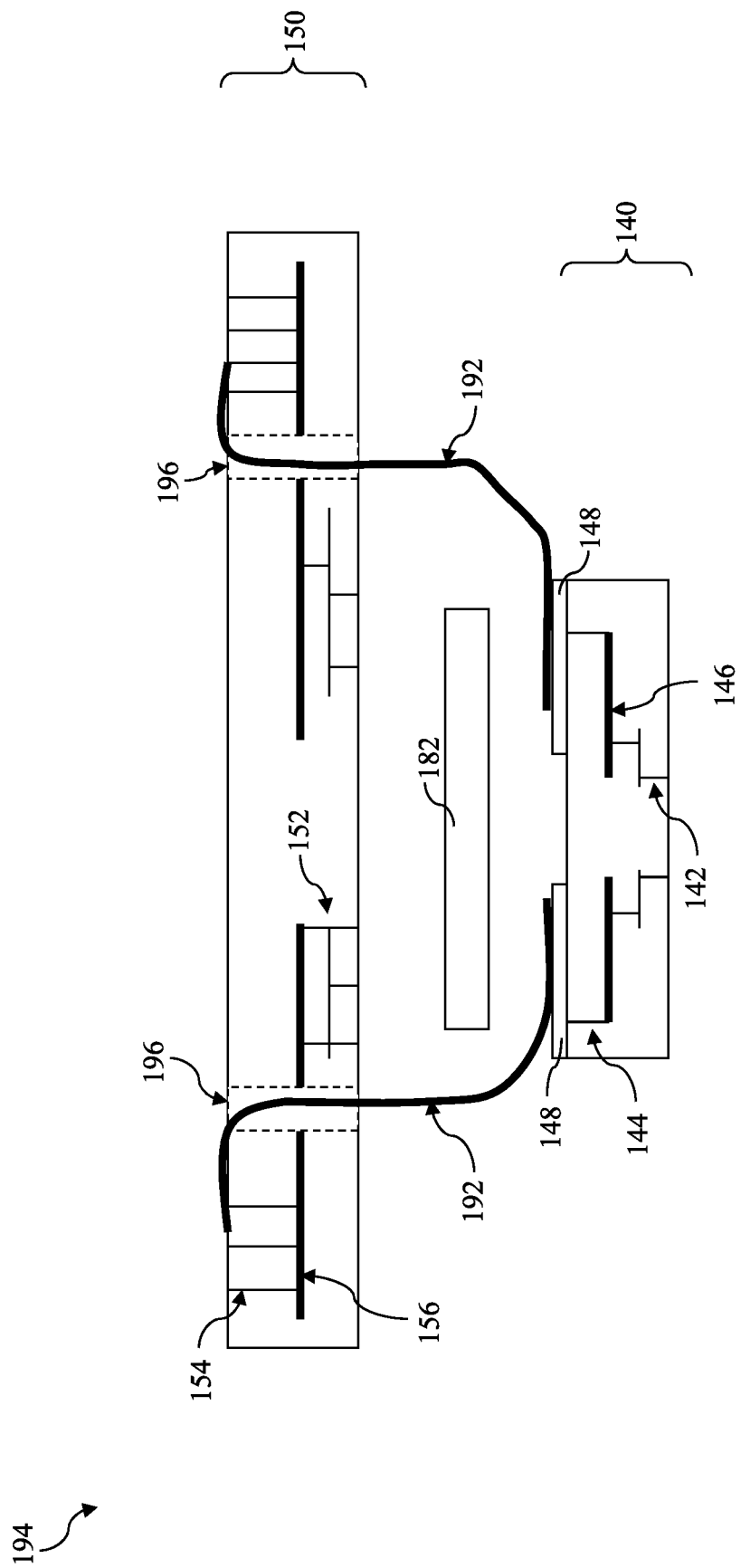

FIG. 10 is a schematic view of a probe card 194 constructed according to various aspects of the present disclosure in another embodiment. The probe card 194 is similar to the probe card 190 of FIG. 9. Particularly, the probe card 190 includes the conductive plate 148 formed on the space transformer 140. The interposer 182 is configured between the space transformer 140 and the PCB 150. However, the probe card 194 does not include the conductive plate 158 formed on the PCB 150 as illustrated in FIG. 8. Instead, the probe card 194 includes one or more through holes (or openings) 196 formed on the PCB 150. The holes 196 are designed with proper positions and geometries, such that the flexible membrane circuits 192 are able to pass through the PCB 150 and make proper contacts to the top surface of the PCB 150. More particularly, each of the flexible membrane circuits 192 has a first end bonded to the top surface of the PCB 150 and a second end inserted between the interposer 182 and the space transformer 140. By using the flexible membrane circuits 192, the conductive plate 148, and the interposer 182, the power and ground lines are efficiently coupled between the space transformer 140 and the PCB 150.

Figure 11:
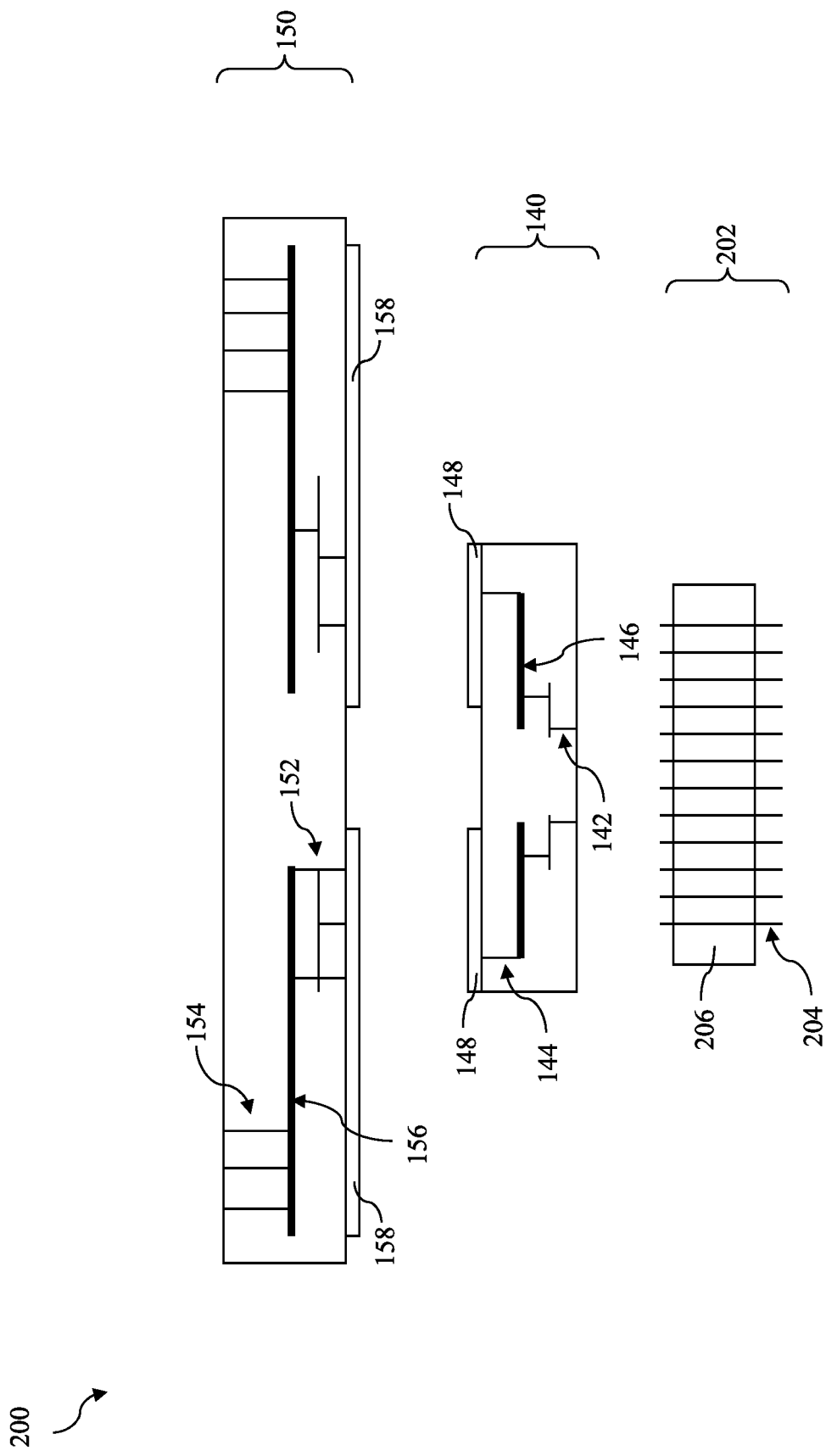

FIG. 11 is a schematic view of a probe card 200 constructed according to various aspects of the present disclosure in another embodiment. The probe card 200 is similar to one of the probe cards illustrated in FIGS. 3-6 and 9-10. Particularly, the probe card 200 includes the conductive plate 148 formed on the space transformer 140. The probe card 200 may further include the conductive plate 158 formed on the printed circuit board 150 as illustrated in FIG. 3. The probe card 200 may further include solder balls 162 configured to bond the signal lines of the PCB 150 and the space transformer 140 as illustrated in FIG. 4. The probe card 200 may further include the high frequency matching circuit 172 formed on the space transformer 140 and coupled with the power and ground lines (or additionally the signal lines) of the space transformer 140 as illustrated in FIG. 5. The probe card 200 may further include the interposer 182 disposed between the PCB 150 and the space transformer 140 to provide efficient coupling as illustrated in FIG. 6. The probe card 200 may further include the flexible membrane circuit 192 incorporated partially between the PCB 150 and the interposer 182, and partially between the interposer 182 and the space transformer 140 as illustrated in FIG. 9. The probe card 200 may alternatively include the flexible membrane circuit 192 partially inserted between the space transformer 140 and the interposer 182, and partially formed on the top surface of the PCB 150 as illustrated in FIG. 10.

In the depicted embodiment, the probe card 200 further includes a needle module 202 integrated with the space transformer 140 and the PCB 150. The needle module 202 includes a plurality of needles 204 configured as an array and aligned with the bonding pads in the wafer to be tested. The needles 204 are secured by a matrix 206, such as a Mylar retainer. In one example, the needles 204 are aligned to the bonding pads in one die. The probe card 200 is capable of testing multiple dies in parallel. In this case, the needles 204 are aligned with the bonding pads of multiple dies, such as 2, 4, 8, or 16 dies.

The probe card 200 may further include one or more guide plates (not shown) such as a top guide plate and a bottom guide plate configured above and below the space transformer 140, respectively. The probe card 200 may additionally include one or spacers (not shown) disposed between the needle module 202 and the bottom guide plate for securing and space control.

FIG. 12 illustrates a schematic view of an interposer 210 constructed according to another embodiment. The interposer 210 can be alternatively used in a probe card to replace the interposer 182 of FIG. 7. For example, the interposer 210 can be incorporated into the probe card 180 of FIG. 6, the probe card 190 of FIG. 9, the probe card 194 of FIG. 10. The interposer 210 includes a carrier 212 integrated with a plurality of spring connectors 214. The carrier 212 includes plastic material or other flexible material designed with a proper geometry and dimensions to fit in between the space transformer 140 and the PCB 150.

The spring connectors 214 are designed to be aligned with signal and power/ground lines of the space transformer 140 and the PCB 150, respectively. Particularly, each of the spring connectors 214 includes a metal (or metal alloy) spring 216 embedded in an insulating post 218 as illustrated in FIG. 13. The metal spring 216 provides electrical connection and mechanical strength with expected flexibility for suitable loading force and proper contact to the corresponding signal and power/ground lines, especially when the space transformer 140 and the PCB 150 have non-flat surfaces.

Particularly, the metal spring 216 can be engineered for tuning the electrical resistance and mechanical behavior by the number of windings, metal material, diameter of the spring and spring length. In one embodiment, the metal spring 216 may includes a structure having copper stainless steel spring core with copper coating and nickel/gold finish. The insulating post 218 includes an elastic material such as rubber, polymer or Teflon. The metal spring 216 is embedded in the insulating post 218 as illustrated in FIG. 14 in a top view. In one embodiment, the insulating post 218 is a hollow post having an outer surface 218a and an inside surface 218b as shown in FIG. 14. In various embodiments of the interposer 210 having the spring connectors 214, different advantages may present. For example, when a spring connector fails, only that spring connector is individually replaced, instead of the whole interposer.

Figure 15:
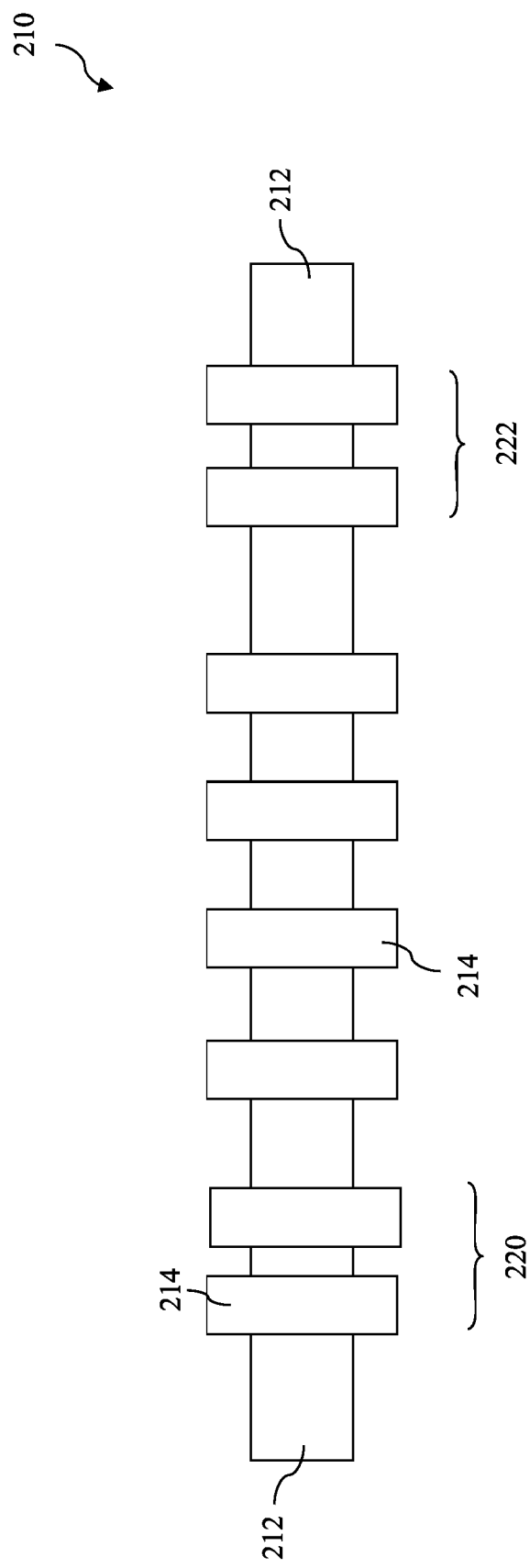

Alternatively, the interposer 210 is designed to include multiple spring connectors configured to be coupled with the power/ground lines of the space transformer 140 and the PCB 150 for increased contact areas and reduced contact resistances. As illustrated in FIG. 15, the spring connectors 214 includes a first subset configured as an array and positioned in a first region 220 aligned with the power lines of the space transformer 140 and the PCB 150. Similarly, the spring connectors 214 includes a second subset configured as another array and positioned in a second region 222 aligned with the ground lines of the space transformer 140 and the PCB 150. In another example, the spring connectors 214 in the power/ground regions 220 and 222 are designed to have large sectional areas to increase the contact areas and decrease the contact resistances.

Thus, the present disclosure provides a probe card for wafer level testing. The probe card includes a space transformer having a power line, a ground line and signal lines embedded therein, herein the space transformer includes various conductive lines having a first pitch on a first surface and a second pitch on a second surface, the second pitch being substantially less than the first pitch; a printed circuit bond configured approximate the first surface of the space transformer; and a power plane disposed on the first surface of the space transformer and patterned to couple the power line and the ground line to the printed circuit board.

In one embodiment, the power plane includes copper foil. In another embodiment, the probe card further includes solder balls configured to couple the signal lines to the printed circuit board. In yet another embodiment, the probe card further includes an additional power plane disposed on the printed circuit board and patterned to couple with the power line and the ground line of the space transformer. The probe card may additionally include a high frequency matching circuit formed on the space transformer and coupled with the power line and ground line of the space transformer. In yet another embodiment, the probe card includes an interposer disposed between the space transformer and the printed circuit board, and coupled the power and ground lines of the space transformer to the printed circuit board. In yet another embodiment, the probe card further includes a flexible membrane circuit having a first end disposed between the printed circuit board and the interposer; and a second end disposed between the space transformer and the interposer. In an alternative embodiment, the flexible membrane circuit has a first end disposed between the space transformer and the interposer; and a second end formed on a top surface of the printed circuit board. In the present embodiment, the printed circuit board includes a through hole that the flexible membrane circuit passes through. In yet another embodiment, the probe card further includes a plurality of needles configured to be aligned with bonding pads of multiple dies of a semiconductor wafer for multiple device test in parallel.

The present disclosure also provides another embodiment of a probe card for wafer level test. The probe card includes a space transformer having a power line, a ground line and signal lines embedded therein, wherein the space transformer includes a first surface having a first pitch and a second surface having a second pitch substantially less than the first pitch; a printed circuit bond configured approximate the first surface of the space transformer; a first power plane disposed on the first surface of the space transformer and patterned to couple the power line and the ground line to the printed circuit board; and a second power plane disposed on a surface of the printed circuit board, patterned to couple the power line and the ground line to the printed circuit board, and bonded with the first power plane.

In one embodiment, the probe card further includes solder balls configured to couple the signal lines to the printed circuit board. In another embodiment, the probe card further includes an interposer disposed between the space transformer and the printed circuit board, and coupled the power and ground lines of the space transformer to the printed circuit board. In furtherance of the embodiment, the probe card further includes a flexible membrane circuit having a first end disposed between the printed circuit board and the interposer; and a second end disposed between the space transformer and the interposer.

The present disclosure also provides an embodiment of a wafer test system. The wafer test system includes a probe card designed to test a wafer. The probe card includes a space transformer having a power line, a ground line and signal lines embedded therein, wherein the space transformer includes various conductive lines having a first pitch on a first surface and a second pitch on a second surface, the second pitch being substantially less than the first pitch; a printed circuit bond configured approximate the first surface of the space transformer; and a first power plane disposed on the first surface of the space transformer and patterned to couple the power line and the ground line to the printed circuit board. The wafer test system further includes a wafer prober designed to hold a wafer to be tested and control the probe card for wafer test; and a tester coupled to the probe card through a connection cable.

In one embodiment, the probe card further includes a second power plane formed on the printed circuit board and coupled with the first power plane. In another embodiment, the probe card further includes a high frequency matching circuit formed on the space transformer and coupled with the power line and ground line of the space transformer. In yet another embodiment, the probe card further includes an interposer disposed between the space transformer and the printed circuit board, and coupled the power and ground lines of the space transformer to the printed circuit board. In yet another embodiment, the probe card further includes a flexible membrane circuit having a first end disposed between the printed circuit board and the interposer; and a second end disposed between the space transformer and the interposer. In an alternative embodiment, the probe card further includes a flexible membrane circuit having a first end disposed between the space transformer and the interposer; and a second end formed on a top surface of the printed circuit board.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A probe card for wafer level test, comprising:
a space transformer having a power line, a ground line, and signal lines embedded therein, wherein the space transformer includes a first surface having a first pitch and a second surface having a second pitch substantially less than the first pitch;
a printed circuit board configured approximate the first surface of the space transformer;
a first power plane disposed on the first surface of the space transformer and patterned to couple the power line and the ground line to the printed circuit board; and a second power plane disposed on a surface of the printed circuit board and patterned to couple the power line and the ground line of the space transformer to the printed circuit board, wherein the second power plane is in electrical connection with the first power plane, the first and second power planes each include a plurality of conductive plates, and the conductive plates each have a greater contact area than a structure coupling the signal lines of the spacer transformer.

2. The probe card of claim 1, further comprising solder balls configured to couple the signal lines of the space transformer to the printed circuit board.

3. The probe card of claim 1, further comprising an interposer disposed between the space transformer and the printed circuit board, the interposer for coupling the power and ground lines of the space transformer to the printed circuit board.

4. The probe card of claim 3, further comprising a flexible membrane circuit having:
   a first end disposed between the printed circuit board and the interposer; and
   a second end disposed between the space transformer and the interposer.

5. A probe card for wafer level testing, comprising:
   a space transformer having a power line, a ground line, and signal lines embedded therein, wherein the space transformer includes various conductive lines having a first pitch on a first surface and a second pitch on a second surface, the second pitch being substantially less than the first pitch;
   a printed circuit board configured approximate the first surface of the space transformer; and
   a plurality of conductive plates disposed on the first surface of the space transformer and patterned to couple the power line and the ground line of the space transformer to the printed circuit board, the conductive plates having a greater contact area than a structure coupling the signal lines of the spacer transformer.

6. The probe card of claim 5, wherein the conductive plates include copper foil.

7. The probe card of claim 5, further comprising solder balls configured to couple the signal lines of the space transformer to the printed circuit board.

8. The probe card of claim 5, further comprising additional conductive plates disposed on the printed circuit board and patterned to couple with the power line and the ground line of the space transformer, wherein the additional conductive plates have a greater contact area than the plurality of conductive plates disposed on the first surface of the space transformer.

9. The probe card of claim 5, further comprising a high frequency matching circuit formed on the space transformer and coupled with the power line and ground line of the space transformer.

10. The probe card of claim 5, further comprising an interposer disposed between the space transformer and the printed circuit board, the interposer for coupling the power and ground lines of the space transformer to the printed circuit board.

11. The probe card of claim 10, further comprising a flexible membrane circuit having:
   a first end disposed between the printed circuit board and the interposer; and
   a second end disposed between the space transformer and the interposer.

12. The probe card of claim 5, further comprising a plurality of embedded conductive plates within the space transformer.

13. The probe card of claim 5, further comprising a plurality of embedded conductive plates within the printed circuit board.

14. The probe card of claim 5, further comprising a plurality of needles configured to be aligned with bonding pads of multiple dies of a semiconductor wafer for multiple device testing in parallel.

15. A wafer test system, comprising:
   a probe card designed to test a wafer including:
      a space transformer having a power line, a ground line, and signal lines embedded therein, wherein the space transformer includes various conductive lines having a first pitch on a first surface and a second pitch on a second surface, the second pitch being substantially less than the first pitch,
      a printed circuit board configured approximate the first surface of the space transformer, and
      a first power plane disposed on the first surface of the space transformer and patterned to couple the power line and the ground line to the printed circuit board, the first power plane comprising a conductive plate having a greater contact area than a structure coupling the signal lines of the space transformer to the printed circuit board;
   a wafer prober designed to hold a wafer to be tested and control the probe card during a wafer test; and
   a tester coupled to the probe card through a connection cable.

16. The wafer test system of claim 15, wherein the probe card further includes a second power plane formed on the printed circuit board and directly coupled with the first power plane.

17. The wafer test system of claim 15, wherein the probe card further comprises a high frequency matching circuit formed on the space transformer and coupled with the power line and ground line of the space transformer.

18. The wafer test system of claim 15, wherein the probe card further comprises an interposer disposed between the space transformer and the printed circuit board, the interposer for coupling the power and ground lines of the space transformer to the printed circuit board.

19. The wafer test system of claim 18, wherein the probe card further includes a flexible membrane circuit having:
   a first end disposed between the printed circuit board and the interposer; and
   a second end disposed between the space transformer and the interposer.

20. The wafer test system of claim 18, wherein the probe card further includes a plurality of embedded conductive plates within the space transformer.

* * * * *